US008965722B2

(12) United States Patent
Yoshida et al.

(10) Patent No.: US 8,965,722 B2
(45) Date of Patent: Feb. 24, 2015

(54) APPARATUS FOR CALCULATING RESIDUAL CAPACITY OF SECONDARY BATTERY

(75) Inventors: Syuuhei Yoshida, Tokoname (JP); Satoru Suzuki, Nagoya (JP)

(73) Assignee: Denso Corporation, Kariya (JP)

(*) Notice: Subject to any disclaimer, the term of this patent is extended or adjusted under 35 U.S.C. 154(b) by 544 days.

(21) Appl. No.: 13/337,497

(22) Filed: Dec. 27, 2011

(65) Prior Publication Data
US 2012/0166116 A1    Jun. 28, 2012

(30) Foreign Application Priority Data

Dec. 27, 2010  (JP) .................................. 2010-290619

(51) Int. Cl.
*G01R 31/36* (2006.01)
(52) U.S. Cl.
CPC ........ *G01R 31/3624* (2013.01); *G01R 31/3658* (2013.01)
USPC .............. 702/63; 320/132; 324/428; 324/429
(58) Field of Classification Search
CPC ........... G01R 31/3624; G01R 31/3637; G01R 31/3648; G01R 31/3658; G01R 31/361; G01R 31/3689
USPC ............ 702/60, 61, 63, 64, 65, 182; 320/116, 320/132; 324/427, 428, 429; 340/636.12
See application file for complete search history.

(56) References Cited

U.S. PATENT DOCUMENTS

| 6,127,805 A | 10/2000 | Kikuchi et al. |
| 2012/0133331 A1* | 5/2012 | Ling et al. ..................... 320/132 |

FOREIGN PATENT DOCUMENTS

| JP | H11-121048 | 4/1999 |
| JP | P2006-038494 A | 2/2006 |
| JP | P2009-129644 A | 6/2009 |

OTHER PUBLICATIONS

Japanese Official Action dated Oct. 23, 2012 issued in corresponding Japanese Application No. 2010-290619, with English translation.

* cited by examiner

*Primary Examiner* — John H Le
(74) *Attorney, Agent, or Firm* — Nixon & Vanderhye P.C.

(57) ABSTRACT

An apparatus for calculating a residual capacity of a secondary battery is provided. The apparatus calculates the residual capacity of energy in the secondary battery which is charged/discharged. The apparatus includes an arithmetic unit which estimates and calculates a first residual capacity based on a charge/discharge voltage corresponding to a residual capacity of the secondary battery, calculates a second residual capacity based on an integrated value of a charge/discharge current of the secondary battery, weights the charge/discharge voltage of the secondary battery with the first residual capacity or the second residual capacity according to the voltage changing rate, and combines the results of the weighting to obtain the residual capacity of the secondary battery.

7 Claims, 4 Drawing Sheets

FIG.3A

| APPARENT SOC | 0 | 10 | 20 | 30 | 40 | 50 | 60 | 70 | 80 | 90 | 100 |
|---|---|---|---|---|---|---|---|---|---|---|---|
| TEMPERATURE | | | | | | | | | | | |
| -10 | | | | | | | | | | | |
| -5 | 2.781 | 3.266 | 3.291 | 3.339 | 3.355 | 3.359 | 3.365 | 3.374 | 3.395 | 3.409 | 3.600 |
| 0 | | | | | | | | | | | |
| 5 | | | | | | | | | | | |
| 10 | | | | | | | | | | | |
| 15 | | | | | | | | | | | |
| 20 | | | | | | | | | | | |
| 25 | 2.745 | 3.355 | 3.386 | 3.425 | 3.440 | 3.453 | 3.467 | 3.486 | 3.515 | 3.599 | 3.600 |
| 30 | | | | | | | | | | | |
| 40 | | | | | | | | | | | |

FIG.3B

| REAL SOC | ... | 80 | 82 | 84 | 86 | 88 | 90 | 92 | 94 | 96 | 98 | 100 |
|---|---|---|---|---|---|---|---|---|---|---|---|---|
| TEMPERATURE | | | | | | | | | | | | |
| -10 | | | | | | | | | | | | |
| -5 | | 88 | 90 | 91 | 93 | 94 | 95 | 97 | 98 | 99 | 100 | |
| 0 | | | | | | | | | | | | |
| 5 | | | | | | | | | | | | |
| 10 | | | | | | | | | | | | |
| 15 | | | | | | | | | | | | |
| 20 | | | | | | | | | | | | |
| 25 | | 80 | 82 | 84 | 86 | 88 | 90 | 92 | 94 | 96 | 98 | 100 |
| 30 | | | | | | | | | | | | |
| 40 | | | | | | | | | | | | |

FIG.4

| AREA | A | B | C | D | E |
|---|---|---|---|---|---|
| VOLTAGE-ESTIMATED $SOC_v$ | 100 | 50 | 0 | 50 | 100 |
| CURRENT-INTEGRATED $SOC_i$ | 0 | 50 | 100 | 50 | 0 |

| dV/dt | SOCi | 0 | 10 | 20 | 30 | 40 | 50 | 60 | 70 | 80 | 90 | 100 |
|---|---|---|---|---|---|---|---|---|---|---|---|---|
| NOT LESS THAN $3 \times 10^{-5}$ | Wi | 0.00 | 0.10 | 0.00 | 0.15 | 1.00 | 1.00 | 0.91 | R | R | 0.15 | 0.00 |
| LESS THAN $3 \times 10^{-5}$ | Wi | 1.00 | 0.90 | 0.70 | 0.70 | 1.00 | 1.00 | 0.80 | 0.85 | 0.90 | 090 | 1.00 |

APPARATUS FOR CALCULATING RESIDUAL CAPACITY OF SECONDARY BATTERY

CROSS-REFERENCE TO RELATED APPLICATION

This application is based on and claims the benefit of priority from earlier Japanese Patent Application No. 2010-290619 filed Dec. 27, 2010, the description of which is incorporated herein by reference.

BACKGROUND OF THE INVENTION

1. Technical Field of the Invention

The present invention relates to an apparatus for calculating a residual capacity of a secondary battery, such as a lead battery, nickel-cadmium battery, nickel-hydrogen battery, lithium secondary battery, lithium-ion secondary battery, or a lithium-ion secondary battery having a positive pole that contains lithium metal phosphate having an olivine structure.

2. Related Art

It is known that, in detecting a residual capacity, or a state of charge (SOC), of energy, in a secondary battery, an apparatus for detecting a residual capacity is used as disclosed in patent documents JP-A-2009-129644 or JP-A-2006-038494. For example, the lithium-ion secondary battery disclosed in the patent document JP-A-2009-129644 has a characteristic in which a flat charge-discharge capacity range is ensured. The flat charge-discharge capacity range accounts for 50% or more of the electrical capacity of the battery, in which a theoretical electrical capacity is the upper limit. In the flat charge-discharge capacity range, when the battery is charged/discharged with a current corresponding to 1 C, the variation of voltage applied across the terminals falls within a capacity range of 0.2 V or less in both of charging and discharging.

Thus, in the lithium-ion secondary battery or in a battery pack that includes the lithium-ion secondary battery disclosed in JP-A-2009-129644, variation in the internal resistance of the lithium-ion secondary battery is reduced for the charge/discharge of current. As a result, stable output having less variation is ensured. It should be appreciated that the battery has a positive pole formed of an olivine material causing less voltage variation and a negative pole formed of an LTO (lithium titanate) material having the similar characteristic to configure a battery cell having less voltage variation.

The apparatus for calculating a residual capacity disclosed in the patent document JP-A-2006-038494 calculates a first residual capacity based on an integrated value of the charge/discharge current of a power storage device. The apparatus also calculates a second residual capacity based on an open-circuit voltage estimated from an internal impedance of the power storage device. Then, the apparatus calculates a third residual capacity that is a final residual capacity of the power storage device. Specifically, the third residual capacity is calculated by weighting the first and second residual capacities using a weight that has been determined according the usage of the power storage device and by combining the weighted states of charge.

When the power storage device is in a state of charge at a temperature of not more than a reference temperature, the weight is adjusted such that the first residual capacity will be weighted more heavily. Also, it is so configured that the weight is determined based on the current changing rate of the charge/discharge current of the power storage device.

In other words, the residual capacity calculated based on current integration and the residual capacity calculated based on voltage estimation are weighted and combined to calculate a final residual capacity. In this case, the calculation based on voltage estimation uses an open-circuit voltage (OCV) estimated from the impedance. Also, using cell temperature T and current changing rate ΔI/Δt as parameters, the weight of the residual capacity calculated based on current integration is increased when the power storage device is in a state of charge at a temperature of not more than a predetermined temperature. In this way, a residual capacity of high accuracy is calculated making use of the advantages of both of the residual capacity based on current integration and the residual capacity based on open-circuit voltage.

In the patent document JP-A-2009-129644 mentioned above, the lithium-ion secondary battery or the battery pack that uses an olivine material is subjected to charge/discharge control under which a SOC is calculated mainly based on current integration. As mentioned above, the lithium-ion secondary battery disclosed in this patent document has an output characteristic in which a flat charge-discharge capacity range is ensured. Therefore, when high load is continuously imposed on a system, such as a vehicle or an HEMS (home energy management system), that uses the lithium-ion secondary battery or the battery pack, the calculation of a SOC based on current integration as mentioned above may result in a large error. Specifically, while high load is continuously imposed on the system, the characteristic line of charge/discharge voltage relative to SOC is flat in the flat charge-discharge capacity range, and thus the calculation of a SOC based on the voltage in the range may lead to a large error, preventing accurate calculation of a SOC.

In the apparatus for calculating a residual capacity as disclosed in the patent document JP-A-2006-038494 mentioned above, an open-circuit voltage is estimated from an impedance and then a residual capacity is calculated based on OCV-SOC characteristics stored in advance. With this process, however, an impedance measurement device is required to be added to the calculation circuit, leading to the increase in the size of the apparatus. In addition, impedance will change with the changes of temperature and current changing rate.

For this reason, the accuracy of calculating a SOC will be deteriorated in a low-temperature area or a high-current area. Meanwhile, in the apparatus, the SOC calculation is mainly based on current integration, in which the weight of a residual capacity obtained by current integration is increased at a certain cell temperature and at a certain current changing rate. As a result, there is a high probability of causing a large error in detecting a SOC under the condition where high load is continuously imposed.

SUMMARY OF THE INVENTION

An embodiment provides a compact and reduced-size apparatus for highly accurately calculating a residual capacity of a secondary battery that has a large flat charge/discharge voltage range.

As an aspect of the embodiment, an apparatus for calculating a residual capacity of a secondary battery is provided, the apparatus calculating the residual capacity of energy in the secondary battery which is charged/discharged. The apparatus includes an arithmetic unit which estimates and calculates a first residual capacity based on a charge/discharge voltage corresponding to a residual capacity of the secondary battery, calculates a second residual capacity based on an integrated value of a charge/discharge current of the secondary battery, weights the charge/discharge voltage of the secondary battery with the first residual capacity or the second residual capacity according to the voltage changing rate, and combines the results of the weighting to obtain the residual capacity of the secondary battery.

BRIEF DESCRIPTION OF THE DRAWINGS

In the accompanying drawings:

FIG. 3A is a diagram illustrating a table that is a first look-up table (LUT) correlating temperature T of a secondary battery, CCV at the temperature T and apparent SOC at the CCV;

FIG. 3B is a diagram illustrating a table that is a second LUT correlating temperature T of a secondary battery, apparent SOC obtained at the temperature T of the first LUT and real SOC;

FIG. 4 is a diagram illustrating a simple example of weighting in areas A to D in the charge/discharge voltage line VL illustrated in FIG. 2;

DETAILED DESCRIPTION OF THE PREFERRED EMBODIMENTS

Figure 1:
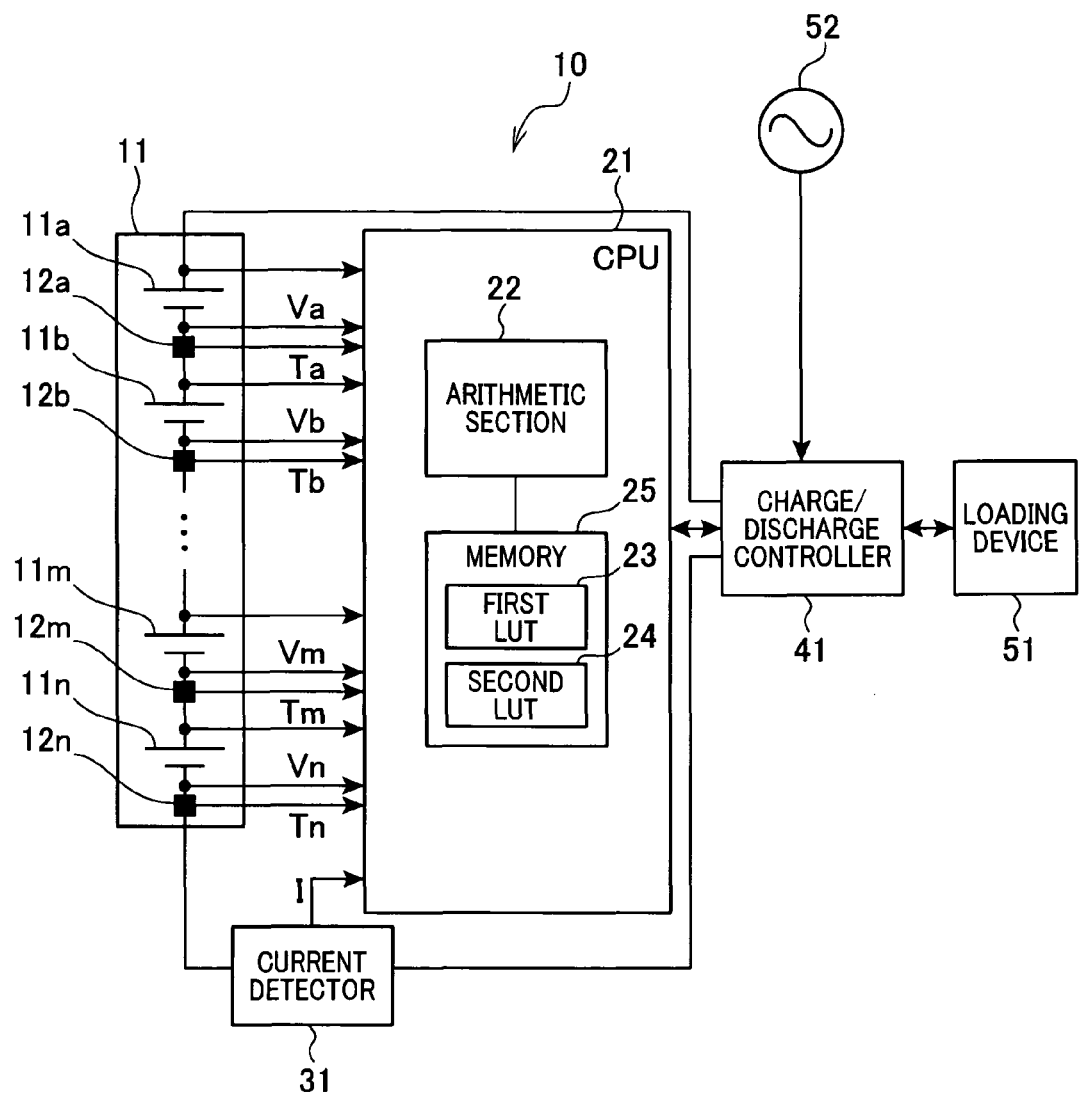
FIG. 1 is a block diagram illustrating a configuration of a battery system using an apparatus for calculating a residual capacity of a secondary battery, according to an embodiment.

With reference to the accompanying drawings, hereinafter will be described an embodiment of the present invention. Throughout the figures referred to in the specification, mutually corresponding components between the figures are given the same reference numerals for the sake of omitting unnecessary explanation.

FIG. 1 is a block diagram illustrating a configuration of a battery system using an apparatus for calculating a residual capacity of a secondary battery, according the embodiment.

As shown in FIG. 1, the battery system 10 includes a battery pack 11, a CPU (central processing unit) 21, a current detector 31 and a charge/discharge controller 41. The battery pack 11 includes secondary batteries 11a, 11b, ..., 11m and 11n connected in series and temperature sensors 12a, 12b, ..., 12m and 12n that detect a cell temperature of the secondary batteries 11a, 11b, ..., 11m and 11n, respectively. The CPU 21 has a processing function as the apparatus for calculating a residual capacity of the secondary batteries 11a, 11b, ..., 11m and 11n. The current detector 31 detects a charge/discharge current I, i.e., a charge current to the battery pack 11 or a discharge current from the battery pack 11. The charge/discharge controller 41 is connected to a loading device 51. The charge/discharge controller 41 is also connected a commercial power supply 52 in a detachable manner.

The loading device 51 consumes electrical load of such a system as a motor or a hybrid motor of a vehicle, air conditioner for household or commercial use, or a motive power source. The loading device 51 performs a predetermined operation suitable for the electrical power supplied to the system from the battery pack 11 via the charge/discharge controller 41.

The charge/discharge controller 41 allows the battery pack 11 to supply (discharge) electrical power to the loading device 51 in response to a charge/discharge instruction from the CPU 21. At the same time, the charge/discharge controller 41 allows the electrical power from the commercial power supply 52 to be outputted to the battery pack 11. With the output from the commercial power supply 52, the battery pack 11 is charged. Alternatively, if the loading device 51 has a function of generating electrical power as performed by a hybrid motor of a vehicle, the charge/discharge controller 41 effects control such that the electrical power from the loading device 51 is charged to the battery pack 11.

In the present embodiment, each of the secondary batteries 11a to 11n is made up of a lithium-ion secondary battery having a positive pole that uses lithium metal phosphate having an olivine structure. Alternatively, a different secondary battery may be used, such as a lead battery, nickel-cadmium battery, nickel-hydrogen battery, lithium secondary battery or lithium-ion secondary battery. To the CPU 21, the secondary batteries 11a to 11n output respective output voltages Va, Vb, ..., Vm and Vn, as well as respective cell temperatures Ta, Tb, ..., Tm and Tn, as temperature information, detected by the respective temperature sensors 12a to 12n.

The CPU 21 includes an arithmetic section (unit) 22 and a memory 25. The arithmetic section 22 calculates, for example, a residual capacity, i.e. a state of charge (SOC), of the secondary batteries 11a to 11n according to the output voltages Va to Vn of the secondary batteries 11a to 11n, the cell temperatures Ta to Tn from the temperature sensors 12a to 12n and the charge/discharge current I from the current detector 31. The details of the secondary batteries 11a to 11n will be described later. The memory 25 stores a first LUT (look up table) 23 and a second LUT 24, which will be described later.

Figure 2:
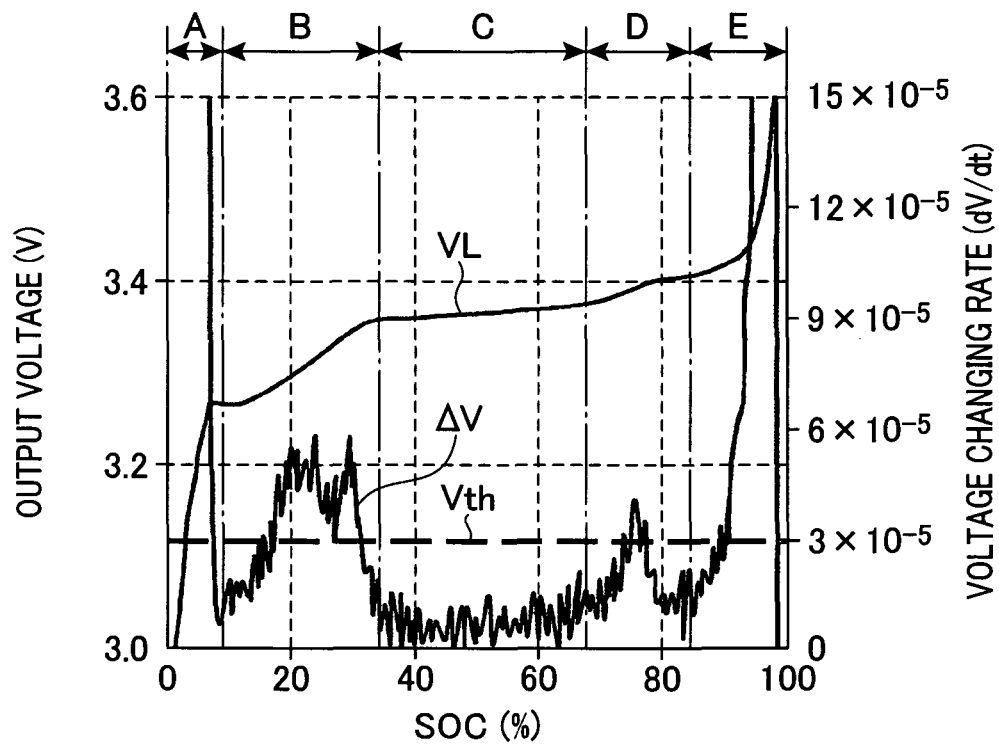
FIG. 2 is a diagram illustrating charge/discharge voltage line VL, voltage changing rate line ΔV and predetermined threshold Vth of a lithium-ion secondary battery.

FIG. 2 is a diagram illustrating charge/discharge voltage line VL, voltage changing rate curve ΔV and predetermined threshold Vth of each of the lithium-ion secondary batteries 11a to 11n. A residual capacity is calculated by the arithmetic section 22 as follows using, for example, the values shown in FIG. 2, which are characteristic of a lithium-ion secondary battery.

In FIG. 2, the left vertical axis indicates output voltage Va (V) of one lithium-ion secondary battery (e.g., battery 11a) in the battery pack 11. The right vertical axis indicates voltage changing rate dV/dt of the battery. The horizontal axis indicates SOC (%). The line VL indicates voltage of the lithium-ion secondary battery, the voltage corresponding to a SOC at the time of charging/discharging a current corresponding to (⅓)×C (hereinafter this voltage is simply referred to as "charge/discharge voltage"). The line ΔV indicates voltage changing rate (dV/dt) relative to SOC. The straight line Vth indicates predetermined threshold.

The threshold Vth is the threshold of the voltage changing rate dV/dt, which is used in calculating a residual capacity. The threshold Vth here is $3\times10^{-5}$ (V/s). The line VL is referred to as a "charge/discharge voltage line", while the line ΔV is referred to as a "voltage changing rate line".

The "n" number of lithium-ion secondary batteries 11a to 11n constituting the battery pack 11 are connected in series. Accordingly, when all of the "n" number of lithium-ion secondary batteries 11a to 11n is concerned, the output voltage Va(V) of the single lithium-ion secondary battery 11a may be multiplied by "n". The temperature information is obtained by averaging the cell temperatures Ta to Tn.

In some portions of the charge/discharge voltage line VL shown in FIG. 2, the voltage changing rate dV/dt indicated by the voltage changing rate line ΔV is equal to or more than the threshold Vth. In these portions, voltage is heavily weighted with a real SOCv obtained through voltage estimation described later. In different portions of the line VL, the voltage changing rate dV/dt indicated by the line ΔV is less than the threshold Vth. In these portions, voltage is heavily weighted with a SOCi obtained through current integration described later.

The results of the weighting with the real SOCv and the results of the weighting with the SOCi are combined (added) to obtain a SOC(n) of the secondary battery 11a. Hereinafter, the real SOCv obtained through voltage estimation is also referred to as "voltage-estimated SOCv", while the SOCi obtained through current integration is also referred to as "current-integrated SOCi".

The current integration is performed using the following expression (1) to obtain the current-integrated SOCi.

$$SOCi = SOC(n-1) \times \Sigma(I \times t)/Cp \qquad (1)$$

where "SOC(n−1)" indicates a residual capacity of the secondary battery 11a, which has been calculated by the previous calculation of a residual capacity, "I" indicates a charge/discharge current of the secondary battery 11a, "t" indicates a time and "Cp" indicates a temperature-specific real battery capacity.

For example, when the previous residual capacity SOC(n−1) is 40%, a residual capacity of 20% is obtained through the current integration this time based on $\Sigma(I \times t)/Cp$. That is, the charge/discharge current I is integrated in terms of time. The resultant integrated value is divided by the real battery capacity Cp. If the value resulting from the division is 20%, the current-integrated SOCi is 60%.

In the current integration this time, the reason why $\Sigma(I \times t)$ is divided by the real battery capacity Cp is that the secondary battery substantially decreases its capacity of storing electrical power as the number of times of using the battery is increased.

In the voltage estimation, the charge/discharge voltage V, i.e., a CCV (closed-circuit voltage), the charge/discharge current I and the temperature T of the secondary battery 11a are applied to the first LUT 23 shown in FIG. 3A to obtain an apparent SOC (%). Then, the obtained apparent SOC (%) is further applied to the second LUT 24 shown in FIG. 3B to thereby estimate voltage.

Specifically, the table of the first LUT 23 correlates temperature T at intervals of 5° C. in a range of from −10° C. to 30° C. and at 40° C., CCV measured at the temperature T in a stationary condition (e.g., 2.781 to 3.600 (V) or 2.745 to 3.600 (V)), and apparent SOC (0 to 100%) at the CCV. The first LUT 23 is prepared every time current is charged/discharged.

At the same time, the table of the second LUT 24 is also prepared. Specifically, the LUT 24 correlates temperature T, apparent SOC (88 to 100% or 80 to 100%) obtained at the temperature T of the first LUT 23, and real SOC (80 to 100%) that corresponds to the actual SOC.

Thus, the arithmetic section 22 estimates a voltage referring to the first and second LUTs 23 and 24. For example, in the first LUT 23, when the temperature T is −5° C. and the charge/discharge current I is 7 A, the apparent SOC is 90% when CCV is 3.409 V. Thus, the resultant value 90% is applied to the second LUT 24 to obtain the real SOC (=voltage-estimated SOCv) of 82%.

Using the voltage-estimated SOCv and the current-integrated SOCi obtained in this way, the voltage of the charge/discharge voltage line VL is weighted. Then, the results of the weighting are combined to obtain a SOC (%) of the secondary battery 11a. The charge/discharge voltage is weighted, as shown in FIG. 4 in a simplified manner, in individual areas A to E indicated in FIG. 2. Referring to FIG. 4, an outline of the weighting is described first.

Specifically, in the area A of FIG. 2, the voltage changing rate dV/dt exceeds the threshold Vth to a large extent as indicated by the voltage changing rate line ΔV. Accordingly, as shown in FIG. 4, the charge/discharge voltage is weighted using a voltage-estimated SOCv of 100%. In the area B, the voltage changing rate dV/dt is equal to or more than the threshold Vth in about 50% of the area, while being less than the threshold Vth in about 50% of the area. Accordingly, the charge/discharge voltage is weighted using a voltage-estimated SOCv of 50% and a current-integrated SOCi of 50%. In the area C, the voltage changing rate dV/dt is less than the threshold Vth and thus the charge/discharge voltage is weighted using a current-integrated SOCi of 100%. In the area D, the voltage changing rate dV/dt is equal to or more than the threshold Vth in about 50% of the area, while being less than the threshold Vth in about 50% of the area. Accordingly, the charge/discharge voltage is weighted using a voltage-estimated SOCv of 50% and a current-integrated SOCi of 50%. In the area E, the voltage changing rate dV/dt exceeds the threshold Vth to a large extent. Accordingly, the charge/discharge voltage is weighted using a voltage-estimated SOCv of 100%.

As described above, the arithmetic section 22 calculates a SOC(n) that has been obtained as a result of weighting with a voltage-estimated SOCv and a current-integrated SOCi.

Under the condition where the temperature T changes, the charge/discharge voltage line VL may have a portion that includes a point of reverse where the voltage changing rate dV/dt is equal to or more than a predetermined value, and the portion may fall within a predetermined SOC range. In such a portion, a correction is carried out such that the SOC of the secondary battery becomes equivalent to a predetermined residual capacity (e.g., 74%).

Figures 5, 6:
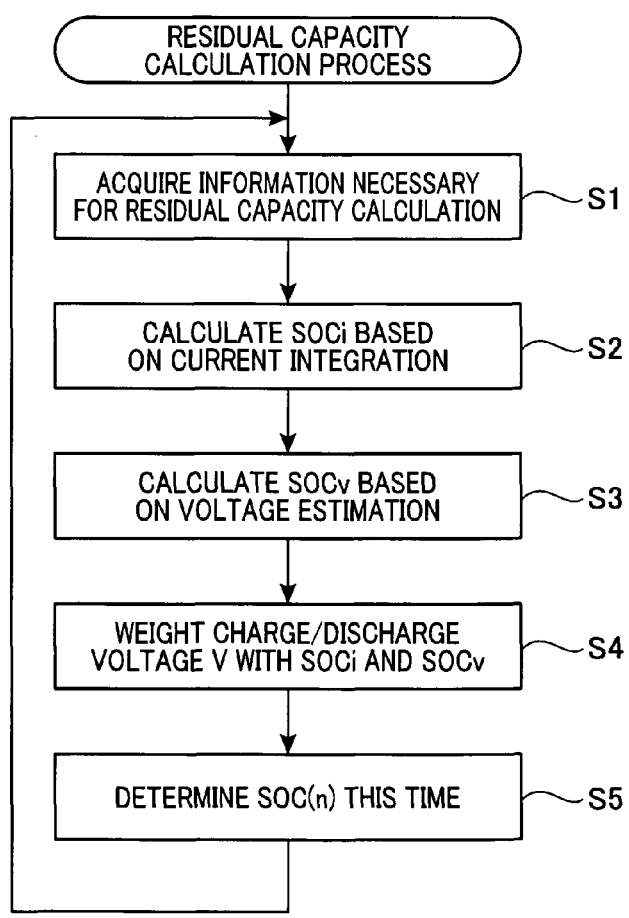
FIG. 5 is a diagram illustrating voltage changing rate dV/dt, threshold ($3\times10^{-5}$ V/s), current-integrated SOCi and weighting with the current-integrated SOCi in the charge/discharge voltage line VL illustrated in FIG. 2.
FIG. 6 is a flow diagram illustrating a process of calculating a residual capacity of a lithium-ion secondary battery.

Referring to FIG. 5, the process of the correction is specifically described. FIG. 5 is a diagram illustrating the voltage changing rate dV/dt, the threshold Vth and the weighting with the current-integrated SOCi, in the charge/discharge voltage line VL shown in FIG. 2. Let us take as an example a point of reverse in the curve VL includes, where the voltage changing rate dV/dt is equal to or more than the threshold Vth of $3 \times 10^{-5}$ and the current-integrated SOCi falls within a preset range of SOC of from 70 to 80(%). For this point of reverse, a correction R is performed to allow the SOC to be unconditionally equivalent to the predetermined residual capacity of 74%.

In FIG. 5, when the voltage changing rate dV/dt is equal to or more than the threshold Vth of $3 \times 10^{-5}$, the current-integrated SOCi of 0% corresponds to the area A of FIG. 2. Accordingly, weighting Wi with the current-integrated SOCi of FIG. 5 is 0.00 (0%). The weighting with the voltage-estimated SOCv, not shown, in this case is 100%. Similarly, the current-integrated SOCi of 10 to 30% corresponds to the area B. Accordingly, the weighting Wi with the current-integrated SOCi is 0.10 (10%), 0.00 (0%) or 0.15 (15%). The weighting with the voltage-estimated SOCv in this case is 90%, 100% or 85%. Further, the current-integrated SOCi of 40 to 60% corresponds to the area C. Accordingly, the weighting Wi with the current-integrated SOCi is 1.00 (100%), 1.00 (100%) or 0.91 (91%). The weighting with the voltage-estimated SOCv in this case is 0%, 0% or 9%. When the current-integrated SOCi is 70 to 80%, the correction R is performed as described above to unconditionally allow the SOC to be equivalent to the predetermined residual capacity of 74%. Further, the current-integrated SOCi of 90 to 100% corresponds to the area E. Accordingly, the weighting Wi with the current-integrated SOCi is 0.15 (15%) or 0.00 (0%). The weighting with the voltage-estimated SOCv in this case is 85% or 100%.

On the other hand, as shown in FIG. 5, in the case where the voltage changing rate dV/dt is less than the threshold Vth of $3\times10^{-5}$, the weighting Wi with the current-integrated SOCi when the rate dV/dt ranges from 0 to 100% is large as expressed by 1.00 (100%), 0.90 (90%) to 0.90 (90%) or 1.00 (100%).

Referring now to FIG. 6, hereinafter is described a process of calculating a residual capacity (hereinafter referred to as "residual capacity calculation") of a lithium-ion secondary battery, which is performed by the CPU 21 in the battery system 10 having the configuration as described above.

FIG. 6 is a flow diagram illustrating the process of the residual capacity calculation of a lithium-ion secondary battery. First, in step S1, necessary information is obtained so that the arithmetic section 22 of the CPU 22 can perform the residual capacity calculation. Specifically, the CPU 21 obtains such information as a charge/discharge voltage Va ("Va" may also be expressed just as "V"), i.e., a CCV, from the secondary battery 11a in the battery pack 11, a cell temperature Ta (expressed as "T") from the temperature sensor 12a of the secondary battery 11a, and a charge/discharge current I from the current detector 31. Then, a voltage changing rate dV/dt that changes with the passage of time is calculated from the charge/discharge voltages Va. Also, a real battery capacity Cp at the cell temperature Ta is calculated. The arithmetic section 22 has its storage means, not shown, which stores the SOC(n−1) that has been calculated in the previous residual capacity calculation.

Then, in step S2, the arithmetic section 22 calculates a current-integrated SOCi. This calculation is performed using expression (1) provided above. Specifically, when the previous SOC(n−1) is 40% and a residual capacity obtained through the current integration this time based on $\Sigma(I\times t)/Cp$ is 20%, the current-integrated SOCi is calculated to be 60%.

Then, in step S3, the arithmetic section 22 calculates a voltage-estimated SOCv. This calculation uses the charge/discharge voltage V that is a CCV of the secondary battery 11a, the charge/discharge current I and the cell temperature T. These values are applied to the first LUT 23 shown in FIG. 3A. For example, when the cell temperature T is −5° C. and the charge/discharge current I is 7 A, the CCV is 3.409 V. In this case, an apparent SOC of 90% is obtained from the first LUT 23 shown in FIG. 3A. Then, the obtained value 90% is applied to the second LUT 24 to thereby obtain a real SOC (=voltage-estimated SOCv) of 82%.

Then, in step S4, the voltage of the charge/discharge voltage line VL is weighted using the voltage-estimated SOCv and the current-integrated SOCi calculated by the arithmetic section 22. For example, in the area A shown in FIG. 2, the voltage changing rate dV/dt indicated by the voltage changing rate line ΔV exceeds the threshold Vth to a large extent. In this case, as shown in FIG. 4, the voltage of the charge/discharge voltage line VL is weighted with the voltage-estimated SOCv of 100%. Also, in the area B, 50% of the voltage changing rate dV/dt is equal to or more than the threshold Vth, and 50% of voltage changing rate dV/dt is less than the threshold Vth. In this case, voltage is weighted with the voltage-estimated SOCv of 50% and the current-integrated SOCi of 50%. The weighting in the areas C to E is performed as shown in FIG. 4.

Then, in step S5, the arithmetic section 22 adds the results of weighting with the voltage-estimated SOCv to the results of weighting with the current-integrated SOCi to obtain an SOC(n) % this time. The SOC(n) this time is written over the previous SOC(n−1) in the storage means of the arithmetic section.

On the other hand, in the weighting in step S4, when, for example, the voltage changing rate dV/dt in the charge/discharge voltage line VL is equal to or more than the threshold Vth of $3\times10^{-5}$, the current-integrated SOCi falls within a range of the predetermined SOC of 70 to 80(%), as shown in FIG. 5. In this case, the correction R is performed at step S5 to allow the SOC(n) % this time to be unconditionally equivalent to the predetermined residual capacity of 74%.

In this way, the CPU 21 as the apparatus for calculating a residual capacity of a secondary battery according to the present embodiment includes the arithmetic section 22 as a calculating means. The arithmetic section 22 estimates and calculates a voltage-estimated SOCv as a first residual capacity, based on a charge/discharge voltage V corresponding to a residual capacity of the secondary battery 11a. Then, the arithmetic section 22 calculates a current-integrated SOCi as a second residual capacity, based on the integrated value of the charge/discharge current I of the secondary battery 11. Then, the charge/discharge voltage V of the secondary battery 11a is weighted with the voltage-estimated SOCv or the current-integrated SOCi according to the voltage changing rate dV/dt. The results of the weighting are combined to thereby obtain a residual capacity of the secondary battery 11a.

This configuration provides the following advantages. In the conventional art, when a loading device connected to the secondary battery 11a is continuously imposed with high load, a residual capacity cannot be detected with high accuracy. This is because the characteristic line VL of the charge/discharge voltage V corresponding to a residual capacity of the secondary battery 11a is rendered to be flat.

In this regard, in the present embodiment, the charge/discharge voltage V corresponding to a residual capacity is weighted according to the voltage changing rate dV/dt of the charge/discharge voltage V. In this case, the voltage is weighted with a voltage-estimated SOCv calculated based on the charge/discharge voltage V or a current-integrated SOCi calculated based on the integrated value of the charge/discharge current I.

Specifically, in the present embodiment, under the condition where the characteristic line VL of the charge/discharge voltage V is flat, the charge/discharge voltage V is weighted with at least the current-integrated SOCi calculated based on the integrated value of the charge/discharge current I. Accordingly, the characteristic line VL of the charge/discharge voltage V is inclined, and thus a residual capacity of the secondary battery 11a is calculated with high accuracy.

In addition, in the present embodiment, an impedance measurement device is not required to be added as was the case in the conventional art. Accordingly, the size of the apparatus will not be increased. In other words, the present embodiment providing simplified and reduced configuration enables highly accurate detection of a residual capacity of the secondary battery 11a that has a large flat charge-discharge capacity range in the charge/discharge voltage V.

The arithmetic section 22 is ensured to estimate a voltage-estimated SOCv based on the charge/discharge voltage V that is a closed-circuit voltage of the secondary battery 11a.

With this configuration, a voltage-estimated SOCv is estimated from the closed-circuit voltage of the secondary battery 11a. Using the obtained voltage-estimated SOCv together with the current-integrated SOCi calculated based on the integrated value of the charge/discharge current I, the charge/discharge voltage V is weighted with the both residual capacities according to the voltage changing rate dV/dt, thereby calculating a residual capacity of the secondary battery 11a.

In the conventional art, in estimating a residual capacity, a closed-circuit voltage has been used after being read as an open-circuit voltage with the aid of an impedance device, because an actually used closed-circuit voltage allows the characteristic line VL of the charge/discharge voltage V to change with the change of temperature and amount of charge. In this regard, according to the present embodiment, reading of a closed-circuit voltage as an open-circuit voltage is not necessary and thus use of the impedance device is omitted.

Also, in calculating the current-integrated SOCi, the arithmetic section 22 is ensured to integrate the charge/discharge current I in terms of time. Then, the arithmetic section 22 is ensured to divide the resultant value of the integration by an actual battery capacity of the secondary battery 11a and to add the resultant value of the division to the previously calculated current-integrated SOCi.

The capacity of the secondary battery 11a for substantially storing electrical power is decreased as the number of times of use of the secondary battery 11a is increased. In this regard, the above configuration of the present embodiment enables calculation of a current-integrated SOCi based on the decreased actual battery capacity.

In calculating a voltage-estimated SOCv, the arithmetic section 22 refers to the first LUT 23 as the first table in which apparent residual capacity is correlated to closed-circuit voltage of the secondary battery 11a. Referring to the first LUT 23, the arithmetic section 22 converts the charge/discharge voltage V that is the closed-circuit voltage of the secondary battery 11a into an apparent residual capacity. Then, the arithmetic section 22 refers to the second LUT 24 as the second table in which real residual capacity, i.e. actual residual capacity, is correlated to apparent residual capacity. Referring to the second LUT 24, the arithmetic section 22 converts the apparent residual capacity obtained by referring to the first LUT 23 into a real residual capacity for use as a voltage-estimated SOCv.

With this configuration, the arithmetic section 22 refers to the first and second LUTs 23 and 24 prepared in advance to thereby convert the charge/discharge voltage V that is the closed-circuit voltage of the secondary battery 11a into an apparent residual capacity, and then converts the apparent residual capacity into a real residual capacity for use as a voltage-estimated SOCv relevant to the charge/discharge voltage V. Accordingly, the above configuration facilitates the estimation of a voltage-estimated SOCv.

In performing weighting, when the voltage changing rate dV/dt of the charge/discharge voltage V of the secondary battery 11a is equal to or more than a predetermined threshold, the arithmetic section 22 heavily weights the voltage V with the voltage-estimated SOCv, or, when less than the predetermined threshold, heavily weights the voltage V with the current-integrated SOCi.

With this configuration, when the voltage changing rate dV/dt of the charge/discharge voltage V is equal to or more than a predetermined threshold, i.e. when the characteristic line VL of the charge/discharge voltage V has a predetermined inclination angle, the charge/discharge voltage V is more heavily weighted with the voltage-estimated SOCv calculated based on the charge/discharge voltage V, than with the current-integrated SOCi. Thus, a residual capacity of the secondary battery 11a can be calculated with high accuracy.

On the other hand, when the voltage changing rate dV/dt of the charge/discharge voltage V is less than the predetermined threshold, i.e. when the characteristic line VL of the charge/discharge voltage V is flat, it has been difficult with the conventional art to detect a residual capacity with high accuracy, because the calculation of a residual capacity corresponding to the charge/discharge voltage V in the conventional art has been based on the flat characteristic line VL. In this regard, in the present embodiment, the charge/discharge voltage V is more heavily weighted with the current-integrated SOCi calculated based on the integrated value of the charge/discharge current I, than with the voltage-estimated SOCv. Thus, a residual capacity of the secondary battery 11a can be calculated with high accuracy.

Further, under the condition where the temperature of the secondary battery 11a changes, the voltage changing rate dV/dt is equal to or more than a predetermined threshold at a point of reverse, and the point of reverse falls within a predetermined residual capacity range. At such a point of reverse, the arithmetic section 22 is ensured to perform a correction to allow the residual capacity of the secondary battery 11a to be a predetermined residual capacity.

With this configuration, under the condition where the temperature of the secondary battery 11a changes, the residual capacity of the secondary battery 11a at a point of reverse is rendered to be the predetermined residual capacity. For example, the predetermined residual capacity at a point of reverse is set to 74%. In this case, when the secondary battery 11a is set to be fully charged with 20 Ah, the predetermined residual capacity of 74% corresponds to 14.8 Ah. However, the secondary battery 11a, when it is deteriorated, may be fully charged with 16 Ah, for example, meanwhile, the predetermined residual capacity remains at the initially set value of 14.8 Ah.

In other words, when the battery is fully charged with 16 Ah, the predetermined residual capacity of 74% should indeed correspond to 11.84 Ah, however, the initially set value of 14.8 Ah remains as it is, creating an unfavorable condition. Accordingly, in the case where the battery is fully charged with 16 Ah, a correction may be forcibly made to the predetermined residual capacity of 74% at the point of reverse. With this correction, a proper predetermined residual capacity of 74% is obtained, which is based on the full charge of the battery with 16 Ah as being 100%.

The threshold mentioned above may be set to $3 \times 10^{-5}$. Thus, the voltage changing rate dV/dt can be clearly defined between $3 \times 10^{-5}$ or more and less than $3 \times 10^{-5}$.

The characteristic line of the charge/discharge voltage V of the secondary battery 11a is an $(1/3) \times C$ charge/discharge voltage V line. In the $(1/3) \times C$ charge/discharge voltage V line, the residual capacity of the secondary battery 11a may fall within a range of 10% to 50% and a range of 60% to 90%, with the voltage changing rate dV/dt being at least $3 \times 10^{-5}$ or more.

With this configuration, the secondary battery 11a having a characteristic line of $(1/3) \times C$ charge/discharge voltage V is limited to a lithium-ion secondary battery 11a. In this lithium-ion secondary battery 11a, the advantages similar to those described above are obtained.

Hereinafter, aspects of the above-described embodiments will be summarized.

As an aspect of the embodiment, an apparatus for calculating a residual capacity of a secondary battery is provided, the apparatus calculating the residual capacity of energy in the secondary battery which is charged/discharged. The apparatus includes an arithmetic unit which estimates and calculates a first residual capacity based on a charge/discharge voltage corresponding to a residual capacity of the secondary battery, calculates a second residual capacity based on an integrated value of a charge/discharge current of the secondary battery, weights the charge/discharge voltage of the secondary battery with the first residual capacity or the second residual capacity according to the voltage changing rate, and combines the results of the weighting to obtain the residual capacity of the secondary battery.

This configuration provides the following advantages. In the conventional art, when a loading device connected to the secondary battery is continuously imposed with high load, a residual capacity cannot be detected with high accuracy. This is because the characteristic line of the charge/discharge voltage corresponding to the residual capacity of the secondary battery is rendered to be flat.

In this regard, the charge/discharge voltage corresponding to a residual capacity is weighted according to the voltage changing rate of the charge/discharge voltage. In this case, the voltage is weighted with a first residual capacity calculated based on the charge/discharge voltage or a second residual capacity calculated based on the integrated value of the charge/discharge current.

Specifically, under the condition where the characteristic line of the charge/discharge voltage is flat, the charge/discharge voltage is weighted with at least the second residual capacity calculated based on the integrated value of the charge/discharge current. Accordingly, the characteristic line of the charge/discharge voltage is inclined, and thus a residual capacity of the secondary battery is calculated with high accuracy.

In addition, an impedance measurement device is not required to be added as was the case in the conventional art. Accordingly, the size of the apparatus will not be increased. In other words, the present embodiment providing simplified and reduced configuration enables highly accurate detection of a residual capacity of the secondary battery that has a large flat charge-discharge capacity range in the charge/discharge voltage.

In the apparatus, in estimating the first residual capacity, the arithmetic unit estimates the first residual capacity based on a charge/discharge voltage that is a closed-circuit voltage of the secondary battery.

With this configuration, a first residual capacity is estimated from the closed-circuit voltage of the secondary battery. Using the obtained first residual capacity together with the second residual capacity calculated based on the integrated value of the charge/discharge current, the charge/discharge voltage is weighted according to the voltage changing rate, thereby calculating a residual capacity of the secondary battery.

In the conventional art, in estimating a residual capacity, a closed-circuit voltage has been used after being read as an open-circuit voltage with the aid of an impedance device, because an actually used closed-circuit voltage allows the characteristic line of the charge/discharge voltage to change with the change of temperature and amount of charge. In this regard, according to the present embodiment, reading of a closed-circuit voltage as an open-circuit voltage is not necessary and thus use of the impedance device is omitted.

In the apparatus, in calculating the second residual capacity, the arithmetic unit integrates the charge/discharge current in terms of time, and divides the resultant value of the integration by an actual battery capacity of the secondary battery to add the resultant value of the division to the previously calculated second residual capacity.

The capacity of the secondary battery for substantially storing electrical power is decreased as the number of times of use of the secondary battery is increased. In this regard, the above configuration of the present embodiment enables calculation of a second residual capacity based on the decreased actual battery capacity.

In the apparatus, in estimating the first residual capacity, the arithmetic unit refers to a first table in which apparent residual capacity is correlated to closed-circuit voltage of the secondary battery, converts a charge/discharge voltage that is a closed-circuit voltage of the secondary battery into an apparent residual capacity, then refers to a second table in which actual residual capacity is correlated to the apparent residual capacity, converts the apparent residual capacity obtained by referring to the first table into an actual residual capacity for use as the first residual capacity.

With this configuration, the calculating means refers to the first and second tables prepared in advance to thereby convert the charge/discharge voltage that is the closed-circuit voltage of the secondary battery into an apparent residual capacity, and then converts the apparent residual capacity into a real residual capacity for use as a first residual capacity relevant to the charge/discharge voltage. Accordingly, the above configuration facilitates the estimation of a first residual capacity.

In the apparatus, in performing weighting, when the voltage changing rate of the charge/discharge voltage of the secondary battery is equal to or more than a predetermined threshold, the arithmetic unit more heavily weights the voltage with the first residual capacity, or, when less than the predetermined threshold, more heavily weights the voltage with the second residual capacity.

With this configuration, when the voltage changing rate of the charge/discharge voltage is equal to or more than a predetermined threshold, i.e. when the characteristic line of the charge/discharge voltage has a predetermined inclination angle, the charge/discharge voltage is more heavily weighted with the first residual capacity calculated based on the charge/discharge voltage, than with the second residual capacity. Thus, a residual capacity of the secondary battery is calculated with high accuracy.

On the other hand, when the voltage changing rate of the charge/discharge voltage is less than the predetermined threshold, i.e. when the characteristic line of the charge/discharge voltage is flat, it has been difficult with the conventional art to detect a residual capacity with high accuracy, because the calculation of a residual capacity corresponding to the charge/discharge voltage in the conventional art has been based on the flat characteristic line. In this regard, the charge/discharge voltage is more heavily weighted with the second residual capacity calculated based on the integrated value of the charge/discharge current, than with the first residual capacity. Thus, a residual capacity of the secondary battery is calculated with high accuracy.

In the apparatus, the arithmetic unit performs a correction to allow the residual capacity of the secondary battery to be a predetermined residual capacity at a point of reverse, the voltage changing rate being equal to or more than the predetermined threshold at the point of reverse, and the point of reverse falling within a predetermined residual capacity range, under the condition where the temperature of the secondary battery changes.

With this configuration, under the condition where the temperature of the secondary battery changes, the residual capacity of the secondary battery at a point of reverse is rendered to be the predetermined residual capacity. For example, the predetermined residual capacity at a point of reverse is set to 74%. In this case, when the secondary battery is set to be fully charged with 20 Ah, the predetermined residual capacity of 74% corresponds to 14.8 Ah. However, the secondary battery, when it is deteriorated, may be fully charged with 16 Ah, for example, meanwhile, the predetermined residual capacity remains at the initially set value of 14.8 Ah.

In other words, when the battery is fully charged with, the predetermined residual capacity of 74% should indeed correspond to 11.84 Ah, however, the initially set value of 14.8 Ah remains as it is, creating an unfavorable condition. Accordingly, in the case where the battery is fully charged with 16 Ah, a correction may be forcibly made to the predetermined residual capacity of 74% at the point of reverse. With this correction, a proper predetermined residual capacity of 74% is obtained, which is based on the full charge of the battery with 16 Ah as being 100%.

In the apparatus, the threshold is $3\times10^{-5}$.

With this configuration, the voltage changing rate is clearly defined between $3\times10^{-5}$ or more and less than $3\times10^{-5}$.

In the apparatus, a line of the charge/discharge voltage of the secondary battery is an (⅓)×C charge/discharge voltage line in which the residual capacity of the secondary battery falls within a range of 10% to 50% and a range of 60% to 90%, with the voltage changing rate being $3\times10^{-5}$ or more.

With this configuration, the secondary battery having a characteristic line of (⅓)×C charge/discharge voltage is limited to a lithium-ion secondary battery. In this lithium-ion secondary battery, the advantages similar to those set forth above are obtained.

It will be appreciated that the present invention is not limited to the configurations described above, but any and all modifications, variations or equivalents, which may occur to those who are skilled in the art, should be considered to fall within the scope of the present invention.

What is claimed is:

1. An apparatus for calculating a residual capacity of a secondary battery, the apparatus calculating the residual capacity of energy in the secondary battery which is charged/discharged, comprising:

an arithmetic unit which estimates and calculates a first residual capacity based on a charge/discharge voltage corresponding to a residual capacity of the secondary battery, calculates a second residual capacity based on an integrated value of a charge/discharge current of the secondary battery, weights the charge/discharge voltage of the secondary battery with the first residual capacity or the second residual capacity according to the voltage changing rate, and combines the results of the weighting to obtain the residual capacity of the secondary battery; wherein in calculating the second residual capacity, the arithmetic unit integrates the charge/discharge current in terms of time, and divides the resultant value of the integration by an actual battery capacity of the secondary battery to add the resultant value of the division to the previously calculated second residual capacity.

2. The apparatus according to claim 1, wherein in estimating the first residual capacity, the arithmetic unit estimates the first residual capacity based on a charge/discharge voltage that is a closed-circuit voltage of the secondary battery.

3. The apparatus according to claim 1, wherein a line of the charge/discharge voltage of the secondary battery is an (⅓)×C charge/discharge voltage line in which the residual capacity of the secondary battery falls within a range of 10% to 50% and a range of 60% to 90%, with the voltage changing rate being $3\times10^{-5}$ or more.

4. An apparatus for calculating a residual capacity of a secondary battery, the apparatus calculating the residual of energy in the secondary battery which is charged/discharged, comprising:

an arithmetic unit which estimates and calculates a first residual capacity based on a charge/discharge voltage corresponding to a residual capacity of the secondary battery, calculates a second residual capacity based on an integrated value of a charge/discharge current of the secondary battery, weights the charge/discharge voltage of the secondary battery with the first residual capacity or the second residual capacity according to the voltage changing rate, and combines the results of the weighting to obtain the residual capacity of the secondary battery; wherein in estimating the first residual capacity, the arithmetic unit estimates the first residual capacity based on a charge/discharge voltage that is a closed-circuit voltage of the secondary battery, and in estimating the first residual capacity, the arithmetic unit refers to a first table in which apparent residual capacity is correlated to closed-circuit voltage of the secondary battery, converts a charge/discharge voltage that is a closed-circuit voltage of the secondary battery into an apparent residual capacity, then refers to a second table in which actual residual capacity is correlated to the apparent residual capacity, converts the apparent residual capacity obtained by referring to the first table into an actual residual capacity for use as the first residual capacity.

5. An apparatus for calculating a residual capacity of a secondary battery, the apparatus calculating the residual capacity of energy in the secondary battery which is charged/discharged, comprising:

an arithmetic unit which estimates and calculates a first residual capacity based on a charge/discharge voltage corresponding to a residual capacity of the secondary battery, calculates a second residual capacity based on an integrated value of a charge/discharge current of the secondary battery, weights the charge/discharge voltage of the secondary battery with the first residual capacity or the second residual capacity according to the voltage changing rate, and combines the results of the weighting to obtain the residual capacity of the secondary battery; wherein in performing weighting, when the voltage changing rate of the charge/discharge voltage of the secondary battery is equal to or more than a predetermined threshold, the arithmetic unit more heavily weights the voltage with the first residual capacity, or, when less than the predetermined threshold, more heavily weights the voltage with the second residual capacity.

6. The apparatus according to claim 5, wherein the arithmetic unit performs a correction to allow the residual capacity of the secondary battery to be a predetermined residual capacity at a point of reverse, the voltage changing rate being equal to or more than the predetermined threshold at the point of reverse, and the point of reverse falling within a predetermined residual capacity range, under the condition where the temperature of the secondary battery changes.

7. The apparatus according to claim 5, wherein the threshold is $3\times10^{-5}$.

* * * * *